United States Patent
Sousa et al.

(10) Patent No.: US 8,232,542 B2
(45) Date of Patent: Jul. 31, 2012

(54) PHASE CHANGE MEMORY ELEMENT WITH IMPROVED CYCLABILITY

(75) Inventors: Véronique Sousa, Grenoble (FR); Pierre Desre, Meylan (FR)

(73) Assignee: Commissariat a l'Energie Atomique, Paris (FR)

(*) Notice: Subject to any disclaimer, the term of this patent is extended or adjusted under 35 U.S.C. 154(b) by 0 days.

(21) Appl. No.: 10/577,159

(22) PCT Filed: Nov. 2, 2004

(86) PCT No.: PCT/FR2004/050554
§ 371 (c)(1),
(2), (4) Date: Dec. 6, 2006

(87) PCT Pub. No.: WO2005/045847
PCT Pub. Date: May 19, 2005

(65) Prior Publication Data
US 2007/0072125 A1 Mar. 29, 2007

(30) Foreign Application Priority Data
Nov. 4, 2003 (FR) ...................................... 03 50784

(51) Int. Cl.
*H01L 45/00* (2006.01)
(52) U.S. Cl. .................................... 257/2; 257/E45.002
(58) Field of Classification Search ........ 257/2, E45.002
See application file for complete search history.

(56) References Cited

U.S. PATENT DOCUMENTS

| | | | |
|---|---|---|---|
| 4,115,872 A | 9/1978 | Bluhm | |
| 4,177,475 A | 12/1979 | Holmberg | |
| 4,314,256 A * | 2/1982 | Petrov et al. | 347/262 |
| 4,845,533 A * | 7/1989 | Pryor et al. | 257/4 |
| 5,177,567 A * | 1/1993 | Klersy et al. | 257/4 |
| 5,363,329 A | 11/1994 | Troyan | |
| 5,414,271 A | 5/1995 | Ovshinsky et al. | |
| 2004/0051161 A1* | 3/2004 | Tanaka et al. | 257/528 |
| 2005/0051901 A1* | 3/2005 | Chen | 257/758 |
| 2005/0093092 A1* | 5/2005 | Tran et al. | 257/530 |
| 2008/0001136 A1* | 1/2008 | Chong et al. | 257/4 |
| 2008/0042119 A1* | 2/2008 | Sandoval et al. | 257/4 |

FOREIGN PATENT DOCUMENTS

JP 2000339750 A * 12/2000

* cited by examiner

*Primary Examiner* — Tom Thomas
*Assistant Examiner* — Christopher M Roland
(74) *Attorney, Agent, or Firm* — Oblon, Spivak, McClelland, Maier & Neustadt, L.L.P.

(57) ABSTRACT

A phase-change memory cell including, between two electrical contacts, a portion in a memory material with amorphous-crystalline phase-change and vice versa, as a stack with a central area located between two outmost areas. An interface, inert or quasi-inert from a physico-chemical point of view, is present between the active central area and each passive outmost area. Each passive outmost area is made in a material having a melting temperature higher than that of the material of the active central area.

11 Claims, 9 Drawing Sheets

PHASE CHANGE MEMORY ELEMENT WITH IMPROVED CYCLABILITY

TECHNICAL FIELD

The present invention relates to a phase-change memory cell capable of undergoing a large number of write cycles. This capability is termed <<cyclability>>. Such a memory cell is made on the basis of phase-change memory materials (i.e. capable of passing from an amorphous phase to a crystalline phase and vice versa) and it applies to memories known as phase-change random access memory (PC-RAM).

STATE OF THE PRIOR ART

There are many types of memories and their use depends on the targeted applications and performances. When ultrafast write times are required, one resorts to SRAM (acronym of static random access memory) memories formed by the arrangement of several transistors. The main drawbacks of these memories are that they are volatile (their contents is lost when the electrical power supply is cut off) and that the size of the memory cell is relatively large, which does not allow large storage capacity on a reduced surface. For a larger storage capacity, DRAM (acronym of dynamic random access memory) memories are used in which the electric charges are stored on a capacitance. These memories are also volatile, the retention time of information being of the order of a few tens of microseconds.

EEPROM or FLASH memories are used for applications which require storage of information, even when the electric power supply is cut off. The principle of these memories is based on the storage of electric charges on the floating gate of field effect transistors. Each memory cell consists of one or more semiconductor components. The present trend is to reduce the size of these components, which generates reduction in the read-out signal and reduction in the retention time of the information. Accordingly, the density of this memory type is limited. Further, these memories have relatively long write times, for example of the order of one millisecond, as this is the time required for the electrons to pass under the floating gate via the tunnel effect. These memories also have a limited number of write cycles (of the order of $10^6$). Indeed, retention of information is gradually reduced during the write cycles because defects are created in the gate oxide layer which allows electrons to escape from the floating gate.

New designs of rewritable non-volatile memories are in development. These memories use memory materials such as ferroelectric materials (FERAM memories), magnetic materials (MRAM memories), phase-change materials such as chalcogenides notably based on tellurium which may pass from an amorphous phase to a crystalline phase and vice versa (PC-RAM memories).

The operating principle of PC-RAM memories is therefore based on the amorphous-crystalline transition of a phase-change material sandwiched between two electrical contacts. Each of these contacts generally belongs to a conductor, and the phase-change material is found at the crossing between two conductors which are substantially perpendicular. A memory includes several thereby formed memory cells.

In this type of memory, the read-out signal results from the difference in electrical resistivity between both phases.

Writing is performed thermally and electrically. Application of a write electrical pulse of a few nanoseconds between both electrical contacts causes via the Joule effect, melting of the initially crystalline phase-change material. Arrest of the pulse causes fast quenching which leads to the amorphous phase of the phase-change material (highly resistant or non-conducting state). Return to the initial state is accomplished by applying between both contacts, a pulse of lower intensity and with a duration of the order of ten nanoseconds. This pulse causes crystallization of the phase-change material (lowly resistant or conducting state).

One advantage of these memories of the PC-RAM is that their write time is very short (of the order of few nanoseconds) and much shorter than that of EEPROM memories (of the order of a few milliseconds). Another appeal of these PC-RAM memories is their large cyclability (of the order of $10^{12}$) and much larger than that of EEPROM type memories (of the order of $10^6$). These memories age well.

One attempts to further increase the cyclability of PC-RAM memories beyond $10^{14}$ and therefore to also increase their lifetime so that they may compete with DRAM type memories which have the drawbacks of being volatile.

When a phase-change memory cell arrives at the end of its lifetime, firstly an instability of the resistivity value of the phase-change material is noted when it is in its amorphous phase, which affects the write operations, and then an impossibility of crystallization of the material which makes a return to the initial state impossible.

The US patents with the following numbers illustrate exemplary PC-RAM type memories: U.S. Pat. No. 4,177,475, U.S. Pat. No. 5,363,329, U.S. Pat. No. 5,414,271. These documents recommend inserting between both electrical contacts, regions of phase-change material either with gradual composition or multilayered for the purpose of reducing electro-migration phenomena between an electric contact and a phase-change material, with which the resistivity drift may be reduced over time.

In U.S. Pat. No. 4,177,475, in particular between both electrical contacts, a stack of three layers is found, made on the basis of germanium and tellurium but all of different compositions. The central layer is active, this is the one which will melt and pass from the amorphous state to the crystalline state and vice versa. The outmost layers of the stack are used for compensating, during the cycles, the change in the voltage threshold ensuring the transition between the highly resistant state and the conducting state.

These structures which aim at increasing cyclability do not allow the amount of melted material made amorphous during the cycles to be delimited and stabilized. As a result, there are changes in the extent of the melted area and reproducibility difficulties for the value of the resistance during the write cycles of a same memory cell or else during a same write cycle from one memory cell to another.

FIG. 4A of U.S. Pat. No. 4,177,475 illustrates the fact that, considering the different compositions of the central layer and of both outmost layers, an interdiffusion of the components of the outmost layers and of the central layer occurs. Even if the outmost layers do not change state or not completely during a write operation, they are not however passive, their interface with the central layer is not inert from a physico-chemical point of view. More the number of write cycles increases, more the composition of the stack tends towards a single composition close to that of the eutectic which is also that of the central layer initially.

DISCUSSION OF THE INVENTION

The object of the present invention is to propose a phase-change type memory cell with improved cyclability and ageing, but not having the limitation and difficulties mentioned above.

More specifically, an object of the invention is to propose a phase-change memory cell in which the amount of phase-change memory material which melts and becomes amorphous, is delimited and stabilized under the effect of write pulses.

Another object of the invention is to propose a phase-change memory cell for which the value of the resistance of the phase-change memory material remains substantially constant over time or remains substantially constant relatively to that of a neighboring memory cell when several memory cells are associated in a memory.

Still another object of the invention is to obtain lateral confinement of the amount of melted phase-change memory material under the effect of write pulses.

Still another object of the invention is to propose a phase-change memory cell with improved sensitivity to write pulses and with reduced power consumption.

Yet another object of the invention is to propose a phase-change memory cell for which the read-out signal will not or hardly not deteriorate over time.

Finally another object of the invention is to propose a phase-change memory cell with increased writing speed.

To achieve this, the present invention is a phase-change memory cell including between two electrical contacts, a portion in a memory material with an amorphous-crystalline phase change and vice versa, as a stack, with a central area located between two outmost areas. According to the invention, an inert or quasi-inert interface from a physico-chemical point of view, is present between the so-called central area and each so-called passive outmost area, each passive outmost area being made in a material having a higher melting temperature than that of the material of the active central area.

By physico-chemical equilibrium or quasi-equilibrium between both phases, is meant the equilibrium which is achieved at a given temperature, when the chemical potential of each constituent has substantially the same value in both coexisting phases. This equilibrium is physico-chemical as it results from a physical transformation between both phases.

Thus, with this inert or quasi-inert interface stack, the amount of melted material during a write operation is delimited and stabilized.

In order to improve the sensitivity of the memory cell during writing and to reduce its power consumption, each passive outmost area is preferably made in a material having a thermal conductivity less than or equal to that of the material of the electrical contact which is closest to it and/or that of the material of the active central area.

In order to avoid any deterioration of the read-out signal, the passive outmost areas may have, in a crystalline phase, an electric resistance less than or equal to that of the active central area when it is in a crystalline phase.

In order to obtain increased writing speed, each passive outmost area may be made in a material promoting a phenomenon of crystalline germ formation in the active central area in proximity to the interface.

It is possible that each passive outmost area is made in a material, substantially of the same chemical nature, but with a composition different from that of the material of the active central area.

The material of the active central area may include between about 16% and 30% of tellurium and between about 84% and 70% of antimony, the material of each passive outmost area being antimony possibly mixed with tellurium at a percentage ranging up to 2%, these percentages being atomic percentages.

In another embodiment, each passive outmost area may be made in a material which is of a different chemical nature from that of the material of the active central area, this material having very low solubility in the material of the active central area.

The material of the active central area may be $Ge_2Sb_2Te_5$ and the material of each passive outmost area GeN.

For the purpose of simplification, the passive outmost areas may be made in a same material.

In order to further improve the stabilization and the delimitation of the melted area, the active central area may be at least partially confined laterally by electrically insulating material.

At least one of the passive outmost areas may laterally overlap from the active central area, the selection being made according to the heat conductivity of the material which composes it. In another embodiment, at least one of the passive outmost areas and the active central area coincide laterally.

It also possible that at least one of the passive outmost areas is bordered with electrically insulating material.

The present invention also relates to a phase-change memory which includes a plurality of the thereby defined memory cells.

The present invention also relates to a method for manufacturing at least one phase-change memory cell including, between a first and second electrical contacts, a portion in a memory material with an amorphous-crystalline phase change and vice versa, with a central area located between a first and second outmost areas. The method includes the following steps:

a) making a first electrical contact on a substrate, b) making on the first electrical contact, the first so-called passive outmost area, the so-called active central area and the second so-called outmost area, these areas forming a stack having an inert or quasi-inert interface from the physico-chemical point of view, between each passive outmost area and the active central area which is more meltable than the passive outmost areas, c) achieving at least a partial lateral confinement of at least the active central area with an electrically insulating material, d) making the second electrical contact on the stack.

Steps b) and c) may comprise, after having made the first passive outmost area, the following operations:

depositing the electrically insulating material leading to lateral confinement, on the first passive outmost area, excavating a well in the electrically insulating material with a bottom which reaches the first passive outmost area, filling the well with a layer leading to the active central area, making the second passive outmost area above the well.

Alternatively, steps b) and c) may comprise the following operations:

depositing on the first electrical contact, a first layer leading to the first passive outmost layer, depositing on the first layer, a second layer leading to the active central area, depositing on the second layer, a third layer leading to the second passive outmost area, delimiting as a column, three deposited layers in order to form the stack, laterally coating the stack with an electrically insulating confinement material, this material leading to the confinement.

In another embodiment, steps b) and c) may include the following operations:

depositing on the first passive outmost area, a layer leading to the active central area, delimiting the active central area, laterally coating the active central area with an electrically insulating material, this material leading to confinement, making the second passive outmost area on the active central area.

SHORT DESCRIPTION OF THE DRAWINGS

The present invention will be better understood upon reading the description of exemplary embodiments, given purely as an indication, and by no means limiting, with reference to the appended drawings wherein.

Identical, similar or equivalent portions of the different figures described hereafter bear the same numerical references so as to facilitate the passing from one figure to the other.

The different portions illustrated in the figures are not necessarily illustrated according to a uniform scale, in order to make the figures more legible.

DETAILED DISCUSSION OF PARTICULAR EMBODIMENTS

Figure 1A:
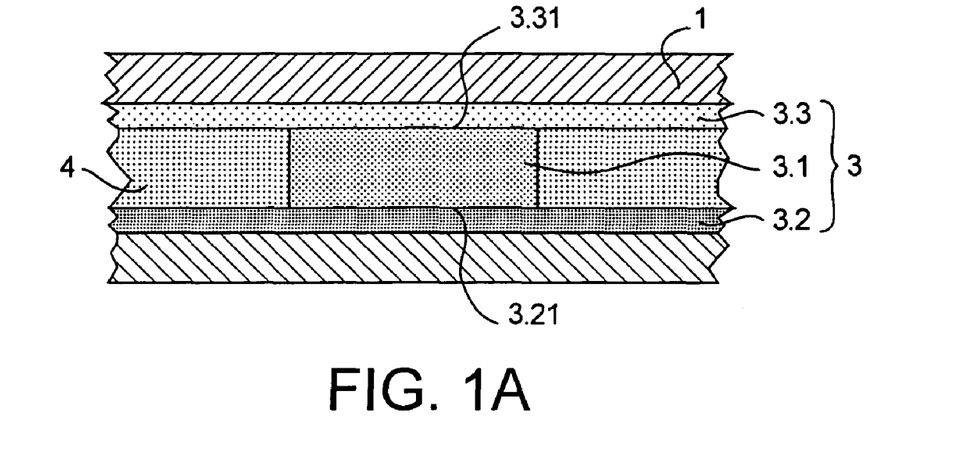
FIGS. 1A and 1B are sections of memory cells according to the invention.

Reference will now be made to the phase-change memory cell according to the invention as illustrated in FIG. 1A or in FIG. 1B. This memory cell includes two spaced-out electrical contacts 1, 2, one of which is intended to be brought to a more positive potential than the other. Both spaced-out contacts 1, 2 are separated by a portion 3 in a phase-change memory material from the chalcogenide family. The electrical contacts 1, 2 are intended to be brought to different potentials during the write cycles of the memory cell. The portion 3 in a phase-change memory material assumes the shape of a stack with a so-called active central area 3.1 sandwiched between two so-called passive outmost areas 3.2, 3.3. There exists between the central area 3.1 and each of the outmost areas 3.2, 3.3, an interface referenced as 3.21 and 3.31, respectively. According to the invention, these interfaces 3.21, 3.31 are inert or quasi-inert from the physico-chemical point of view. The definition of the inert or quasi-inert interface from a physico-chemical point of view was explained earlier.

The active central area 3.1 is thus in direct contact with each of the passive outmost areas 3.2, 3.3. This structure is very simple. The interface 3.21, 3.31 between the active central area 3.1 and each of the passive outmost areas is the common boundary to the active and passive areas. As this interface is inert or quasi-inert, there is no or quasi-no mixing between an active area and a passive area.

The active central area 3.1 may be laterally confined by an electrically insulating area 4. The active central area 3.1 may assume the shape of a pad laterally terminated by the electrically insulating area 4 for example in an oxide or a nitride of a semi-conducting material (for example, silicon oxide or nitride) and terminated at its two ends by the active outmost areas 3.2, 3.3. This lateral termination contributes to good reproducibility of the volume of melted memory material during a write cycle.

The pad may have a diameter of less than 1 micrometer and preferably less than one tenth of a micrometer. The thickness of the electrical contacts 1, 2 may be between 50 and $200 \cdot 10^{-9}$ meters, the thickness of the active central area as well as the thickness of the passive outmost areas may be between 20 and $200 \cdot 10^{-9}$ meters.

In the example illustrated in FIG. 1A, the passive outmost areas 3.2, 3.3 laterally extend beyond the active central area 3.1. They also sandwich the electrically insulating area 4.

Figure 1B:
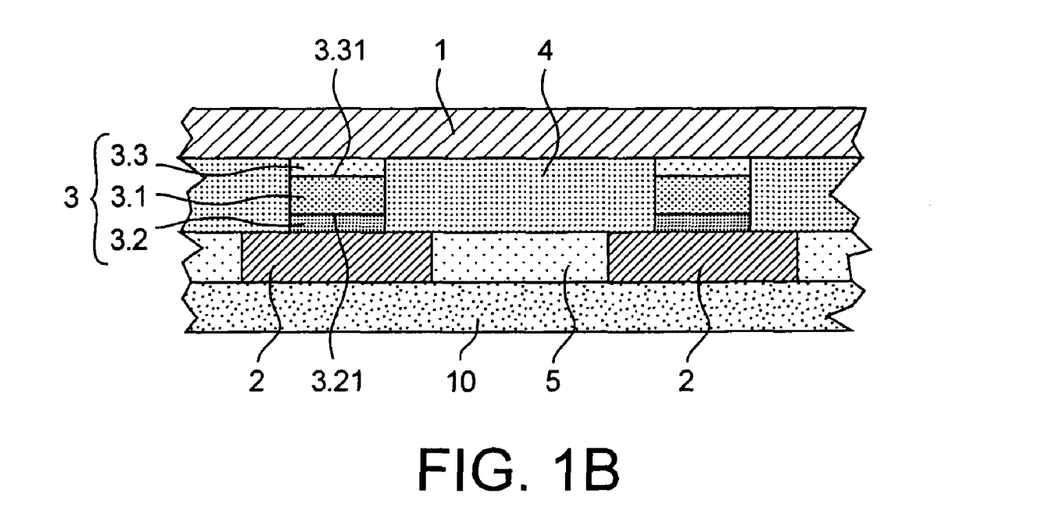

In an alternative illustrated in FIG. 1B, the electrically insulating area 4 laterally confines the whole phase-change memory material portion 3 and not only its active central area 3.1. The passive outmost areas 3.2, 3.3 are also laterally terminated by the electrically insulating area 4. Selecting one structure rather than another depends on the nature of the material of the passive outmost areas and on the ease of technologically making it.

Another difference between FIG. 1A and FIG. 1B is that two memory cells neighboring a memory according to the invention are illustrated in FIG. 1B. These two memory cells have a common electrical contact 1 (in the example, the upper contact) whereas their other electrical contact 2 (the lower contact) is specific to them. Such a memory includes several memory cells arranged as an array network. Thus, in this example, both memory cells are placed on a same line of the array network but not on a same column of the array network. These memory cells are grouped together on a same substrate 10 of suitable nature. The lower contacts 2 specific to each of the memory cells are separated from each other by electrically insulating material 5.

Each passive outmost area may be made in a material which is substantially of the same chemical nature but of a composition different from those of the material of the active central area.

Figure 2:
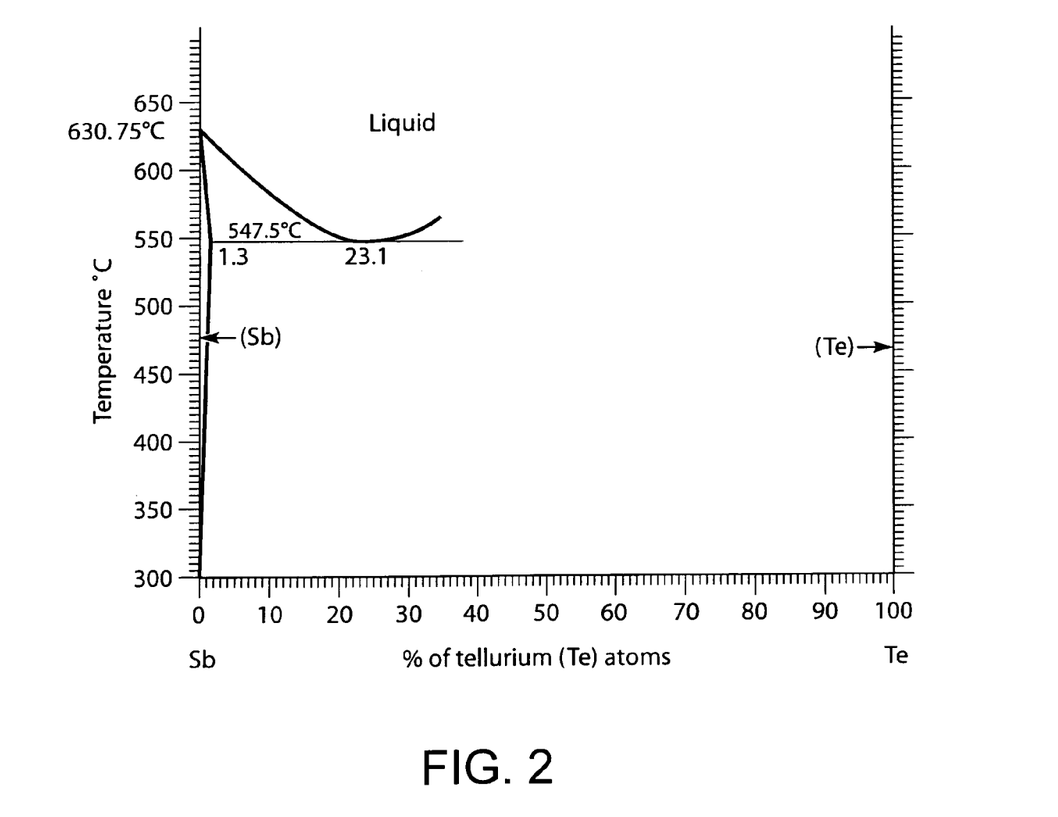
FIG. 2 illustrates a SbTe phase diagram with which the selection of materials of the phase-change portion of a memory cell according to the invention may be explained.

Selection of the materials for the phase-change memory material portion is preferably made by means of a phase diagram showing a eutectic such as the one illustrated in FIG. 2. With this diagram, it is possible to locate the compositions in physico-chemical equilibrium or in quasi-equilibrium and which therefore lead to inert or quasi-inert interfaces. For the purpose of simplification, it is preferable that both passive outmost areas be made in a same material, of course, this is not mandatory, other selections are possible.

The memory material of the active central area may include between about 16% and 30% of tellurium (Te) and between about 84% and 70% of antimony (Sb), its melting temperature being between about 550° C. and 570° C. The memory material of the passive outmost areas should have a melting temperature higher than that of the active material and for example it may be antimony possibly mixed with tellurium up to about 2%. Its melting temperature is between 628° C. and 631° C.

With reference to the Sb—Te phase diagram illustrated in FIG. 2, it is noticed that the physico-chemical equilibrium or quasi-equilibrium may be obtained with, as material for the active central area, about 23.1% of antimony and 76.9% of tellurium, the melting temperature of which is 547.5° C. and with as material for the passive outmost layers, an antimony/tellurium mixture with 1.3% of tellurium. The melting temperature of the eutectic composition of this antimony/tellurium mixture is 630.75° C.

Alternatively, each passive outmost area may be made in a material which is of a chemical nature different from that of the material of the active central area, this material having a product with very low solubility in the material of the active central area.

To illustrate this alternative, the memory material of the active central layer is $Ge_2Sb_2Te_5$ for which the melting temperature is about 600° C. and the memory material of the passive outmost areas is GeN.

The proportions indicated earlier are atomic percentages.

In fact, in order to determine the constitutive material of the active layer, one skilled in the art makes a selection from the materials known for making phase-change memories, for example tellurium, germanium and antimony. In order that this material has maximum meltability, its composition is selected close to the eutectic except for germanium. In the case of a more complex system, i.e., comprising more than two constituents, for the active layer, a meltable material is taken as a material and for the passive layer, a more refractory material, not very soluble in the active layer, and in physico-chemical equilibrium. One skilled in the art proceeds with successive tests in order to select the composition of the layers.

The passive layer may be an electrically conducting ceramic, for example a metal nitride, a metal carbide.

The electrical contacts may be made on the basis of copper, gold, silver, molybdenum, for example.

General investigations on phase-change materials have established that the amorphous-phase-to-crystalline-phase transitions and vice versa are polymorphic transitions, i.e., without any change of composition.

In the melting process followed by amorphization by hyper-quenching, a single phase-change memory material behaves as a pure constituent. During the melting of the phase-change memory material subject to a suitable electric pulse, a fast displacement of a liquid-solid interface occurs, and the velocity of the interface is controlled by the heat flux produced by the Joule effect. This velocity is of the order of several tens of meters per second. The melting delay after applying the electric pulse is extremely small as compared with the supercooling rate of the liquid obtained during the quenching step leading to the amorphous material.

In the case of phase-change memory cells from the prior art, the transitions are always polymorphic as they result from the extreme temperature rise velocity upon applying a pulse aiming at melting the memory material area. The melting of the phase-change memory material is congruent, i.e., without any change of composition during the transition from the solid phase to the liquid phase. If the melting of the phase-change material were not congruent, the diffusion imposed by the phase diagram and leading to segregation would not be able to be accomplished.

A high displacement velocity of the interface during the melting is unfavorable to the reproducibility, during the write cycles, of the melted phase-change memory material amount and this is equivalent to the amount of phase-change memory material made amorphous. This amount significantly varies in response to changes in the injected electrical power. Thus, the electric resistance of the phase-change memory material area varies consequently.

According to the invention, with the stack formed with the active central area and both passive outmost areas, the amount of melted phase-change memory material is delimited and stabilized. It is substantially confined to the central area as obviously congruent melting of the phase-change memory material cannot be prevented. The reproducibility of the amount of melted material is obtained with this three-layer stack.

The memory material of the outmost areas may be of the same chemical nature as the one from the central area but of different composition (see the first example given earlier). This material is in equilibrium or in quasi-equilibrium with the material of the passive central area. Its melting temperature is higher than that of the material of the active central area, i.e., it is more refractory than the material of the active central area. The memory material of the outmost areas will totally or quasi-totally remain crystalline, during the write cycles. It will not melt nor melt in practice.

In the other embodiment, the material of each passive outmost area is of different nature from that of the material of the active central area. It will have very low solubility in the material of the central area. The melting temperature of the material of the passive outmost areas is always higher than that of the material of the active central area, in other words, it is more refractory than the material of the active central area. The memory material of the outmost areas will remain totally or quasi-totally crystalline during the write cycles. It will not melt not melt in practice.

If, exceptionally and for example accidentally, because of failure in making the memory cell, which generates excess power on the electrical contacts causing, by increasing the temperature of interface, partial melting of at least one passive outmost area of the phase-change memory material portion, the inventors have realized that during the melting, the inter-area interface is displaced very little. In the case of a peak excess of power, the latter can only be displaced by diffusing one of the constituents into the melted area. The interface velocity is then only of a few meters per second, a much smaller velocity than that of a polymorphic transformation which is of the order of a few tens of meters per second. Diffusion control in the case of excess power stabilizes during the melting step, the position of the interface between the active central area and each of the passive outmost areas and therefore the resistivity contrast. Reproducibility of the resistance is thereby provided.

In order for this stabilizing effect to be optimum, one seeks to obtain that the read-out pulse has sufficient power to melt the totality of the material of the active central area. If this is not the case, there is a risk of generating a resistance contrast fluctuation because the melted area fluctuations cover small amounts of phase-change material at the interface between the active central area and each of the passive outmost areas. It is even preferable to have a slight surplus of power available, which does not threaten the constancy of the melted amount and therefore made amorphous because of the positional stability of the interface between the active central area and each of the passive outmost areas, as discussed earlier.

Figure 3A:
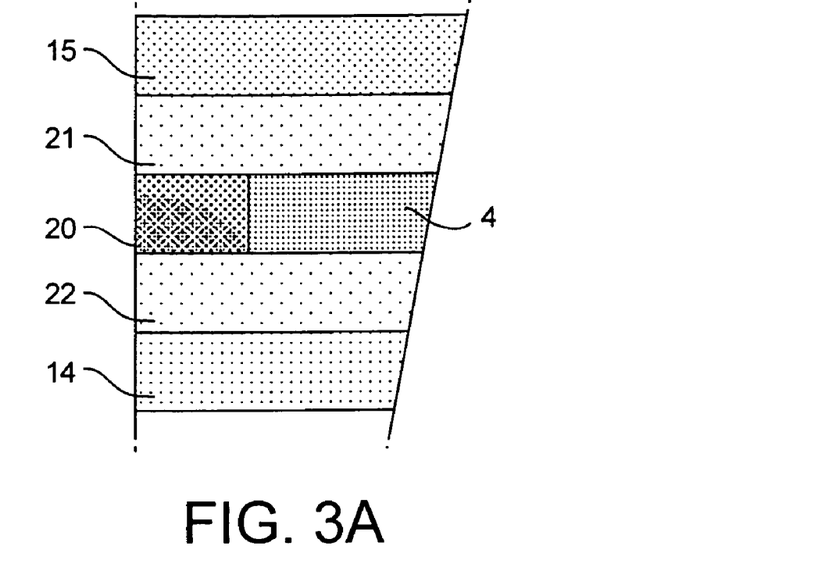
FIGS. 3A, 3B are sectional views of a memory cell from the prior art and of a memory cell according to the invention on which the melted area is materialized.
Figure 3B:
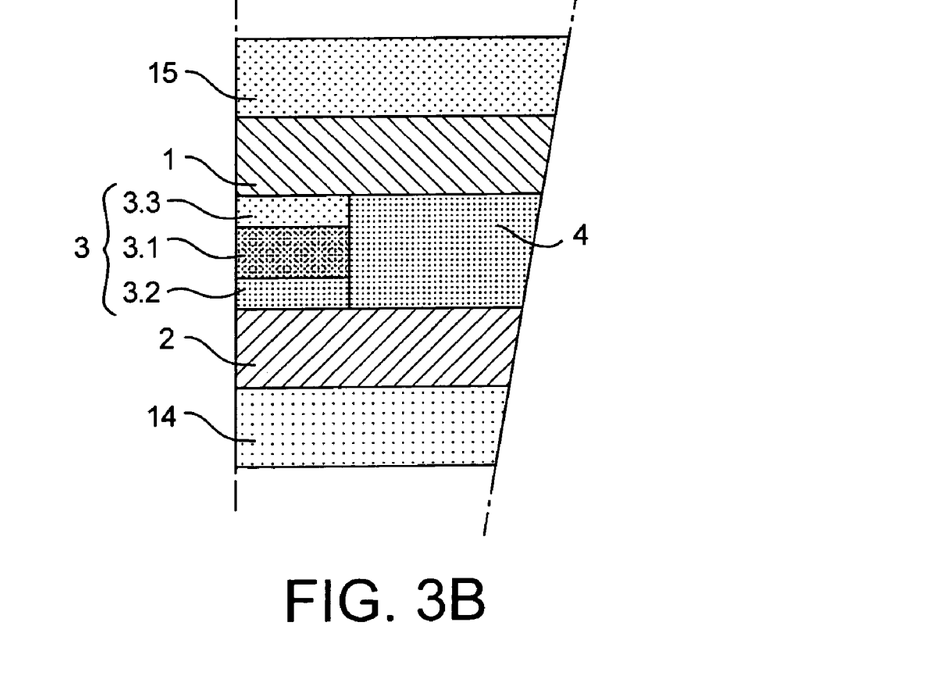

FIGS. 3A, 3B illustrate in a sectional view, modellings of a memory cell from the prior art including between two electrical contacts 21, 22, a portion 20 in a mono-layered phase-change memory material, on the one hand, and a memory cell according to the invention including between two electrical contacts 1, 2, a portion 3 in a three-layer phase-change memory material on the other hand. These memory cells are borne by a for example silicon substrate 14 and are protected at their top by a protective layer 15 for example in silicon nitride. The phase-change memory material portions are laterally confined by the insulator as described earlier. For a same electrical power dissipated into the phase-change memory material portion, in FIG. 3A, only a mushroom-head portion of said area has melted (greyed portion), in FIG. 3B, the whole active central area has melted. The melted portion is also in grey.

Preferably a material having a low thermal conductivity will be selected for making each passive outmost area. The latter conductivity will be less than or equal to that of the material of the electrical contact which is closest to it. It is also preferable that this thermal conductivity be less than or equal to that of the material of the active central area. The material of each passive outmost area acts as a thermal barrier between the material of the active central area and the neighboring electrical contact. The aforementioned U.S. Pat. No. 5,933,365 and U.S. Pat. No. 4,177,475 mention such thermal barriers.

In addition to their thermal role, these barriers are diffusion barriers between the active central area and the electrical contact; with them, it is possible to prevent migrations of cells towards the electrical contacts.

Thus, for equal power, the temperature reached in the stack will be higher than in the case when this condition on heat conductivity is not fulfilled. As a result, less power is needed for melting the totality of the material of the active central area and therefore the sensitivity of the memory cell to the write pulse is improved and power consumption of the memory cell is reduced. This configuration also has the advantage of making the sensitivity of the memory cell substantially constant over time.

Each passive outmost area will preferably have an electrical resistance less than or equal to that of the active central area when it is in its most conducting state, i.e., in its crystalline state. The presence of the passive outmost areas will not affect the resistivity contrast. These passive outmost areas remain totally or quasi-totally crystalline during a write operation on the memory cell. Thus, there will be no gradual deterioration of the read-out signal during the write cycles.

To accelerate the rate of writing into the memory cell, it is advantageous if the material of each passive outmost area promotes heterogeneous nucleation of germs in the material of the active central area when it is an amorphous state and therefore accelerates its crystallization rate during a transition from the amorphous state to the crystalline state. Thus the heterogeneous nucleation rate at the interface is larger than the homogeneous nucleation rate in the material of the active central area. This condition is fulfilled when the material of each passive outmost area is of the same nature as that of the material of the active central area but of different composition.

In the case when the material of each passive outmost area is of a nature different from that of the active central area, this phenomenon may also occur in certain cases, notably when the material of the passive outmost area is GeN and the material of the active central area is GeSbTe. One may refer to the explanations given in the following document: <<Amorphization and crystallization mechanisms in GeSbTe-based phase change optical discs>>, B. Hyot et al., Journal of Magnetics Society of Japan, Vol. 25, No. 3-2 2001, pages 414-419.

Figure 4A:
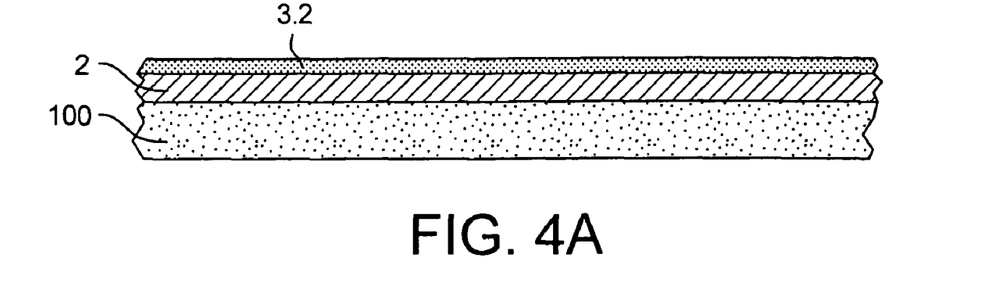
FIGS. 4A-4F illustrate a first example of a method for making at least one memory cell according to the invention.

An exemplary method for making at least one phase-change memory cell according to the invention will now be described. One starts with a substrate 100 of suitable nature, for example in silicon. A first electrical contact 2 for example based on gold, silver, aluminum, copper, is made thereon by a sputtering deposition method (FIG. 4A). This electrical contact 2 is intended to be electrically connected to an addressing device (not shown) itself connected to another device which will notably deliver pulses for writing into the memory cell.

This first electrical contact 2 is covered with a layer 3.2 of phase-change memory material (chalcogenide). This layer will form the first passive outmost area. This deposition may be made by sputtering, for example.

Figure 4B:
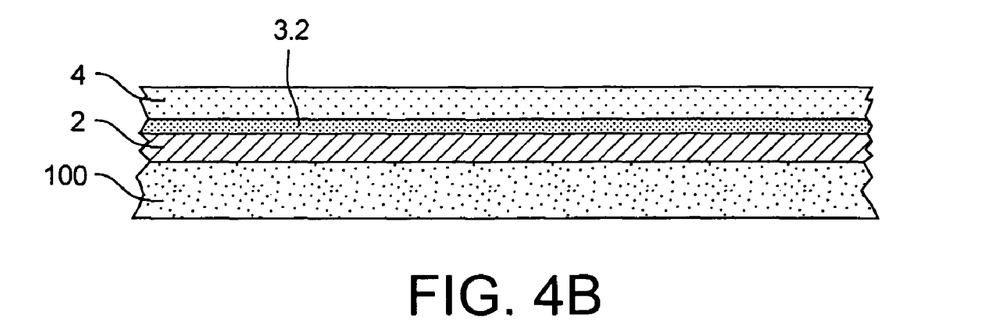

An electrically insulating layer 4, for example in silicon oxide or nitride, is made on top of the first passive outmost area 3.2. This electrically insulating layer may be made by Plasma Enhanced Chemical Vapor Deposition (PECVD) (FIG. 4B).

Figure 4C:
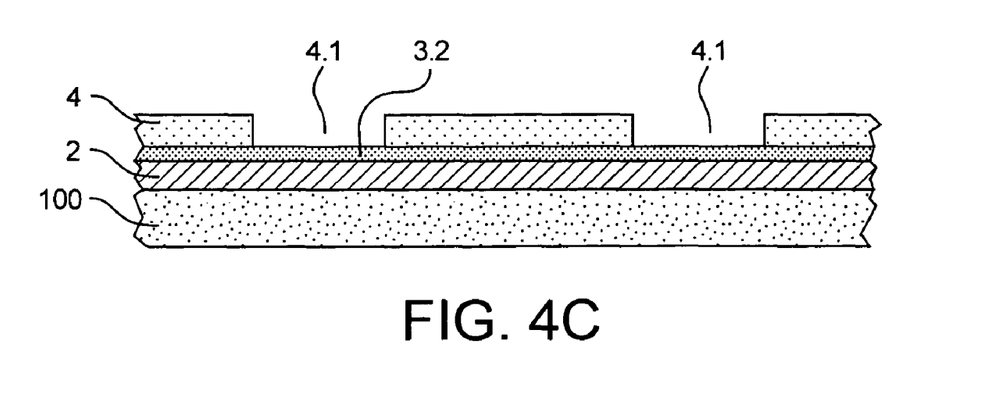

A well 4.1 is then made for each memory cell in the electrically insulating layer 4. The bottom of each well stops on the layer of the first passive outmost area 3.2. Making of this well 4.1 may be performed by reactive ion etching (RIE) (FIG. 4C). It is in this well 4.1 that the active central area 3.1 will be placed. The well 4.1 allows the active central area 3.1 to be at least partially confined laterally.

Figure 4D:
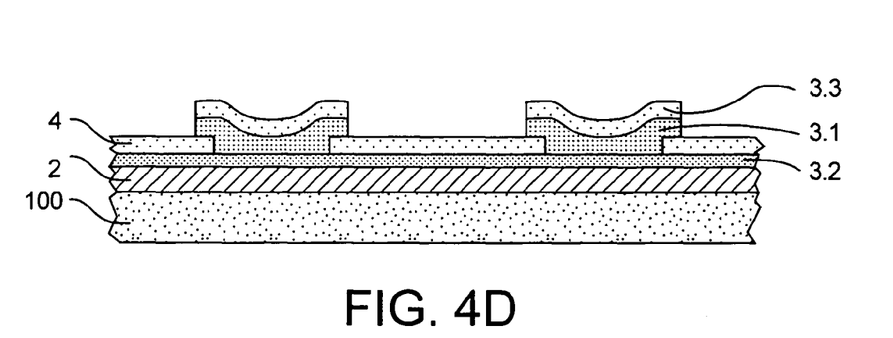

In each well 4.1, a chalcogenide layer is deposited, used as an active central area 3.1. It may overlap around the well 4.1. It is covered with another chalcogenide layer used as a second passive outmost layer 3.3. These coatings, for example with compositions similar to those mentioned in the first example, may be performed for example by sputtering. The contour of both of these layers 3.1, 3.3 (FIG. 4D) is then structured. They may extend laterally beyond the wells 4.1.

Figure 4E:
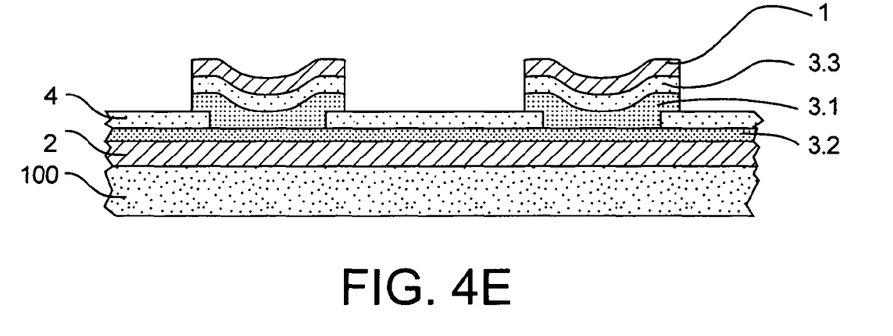

A second electrical contact 1 is then made above each filled well 4.1 (FIG. 4E). Its making may be similar to that of the first electrical contact 2.

Figure 4F:
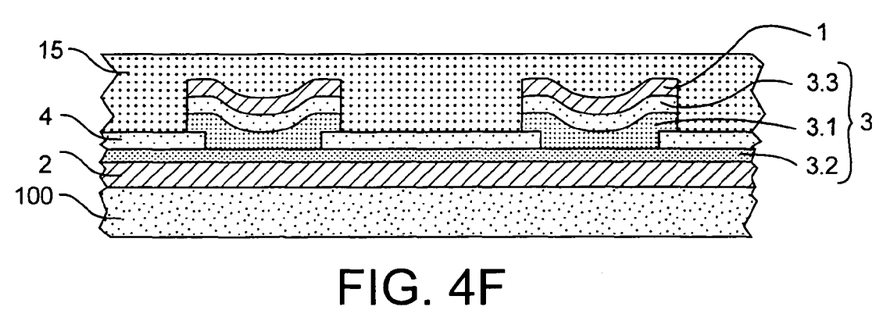

A protective layer 15 may then be deposited on each second electrical contact 1 and around it. Such a layer for example in silicon nitride may be deposited by PECVD (FIG. 4F). This step is optional.

Such a method simultaneously makes several memory cells on the same substrate and therefore a memory according to the invention. In these examples, the electrical contacts are common to several memory cells made on the substrate 100, they are part of electrical conductors laid out in two networks which cross each other.

Figure 5A:
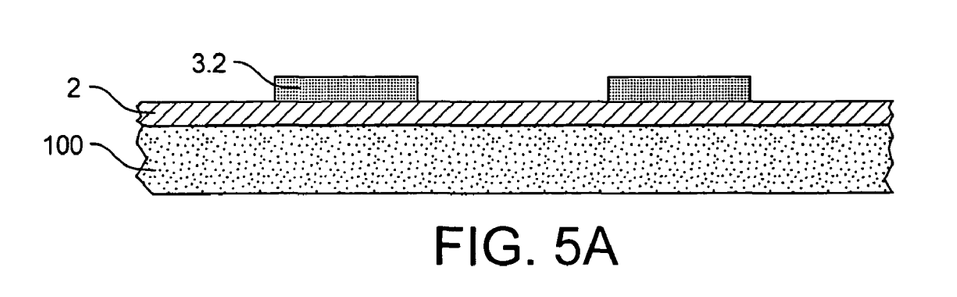
FIGS. 5A-5F further illustrate another example of the method for making memory cells according to the invention.

Alternatively, it is possible to structure the layer leading to the first passive outmost area on each of the simultaneously made memory cells instead of keeping it continuous (FIG. 4). Reference is made to FIGS. 5A-5F. One starts with the substrate 100 covered with a first electrical contact 2 similar to the one illustrated in FIG. 4A. It is assumed that the deposition and etching methods are similar to those mentioned earlier. This first electrical contact 2 is covered with phase-change memory material which will form the first passive outmost area 3.2 of each memory cell. The first electrical contact is common to both cells which will be illustrated in these figures. The memory material is etched for delimiting the contour of each first passive outmost area 3.2 (FIG. 5A).

Figure 5B:
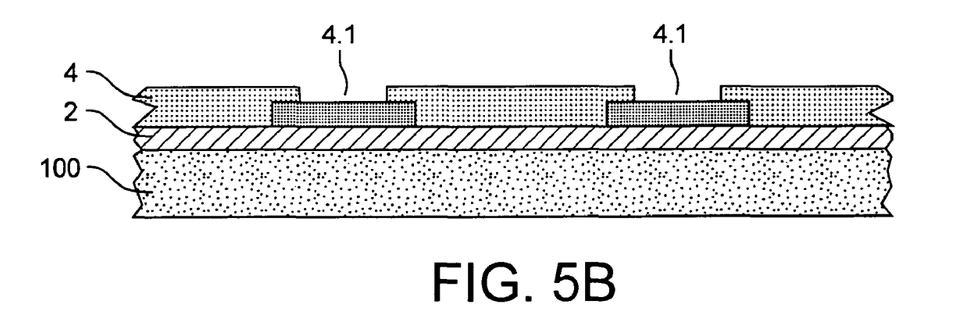

The whole electrically insulating material 4 is covered. In the electrically insulating material 4, a well 4.1 is etched above each of the first passive outmost areas 3.2 (FIG. 5B). The bottom of the wells 4.1 reaches the material of the first passive outmost areas 3.2.

Figure 5C:
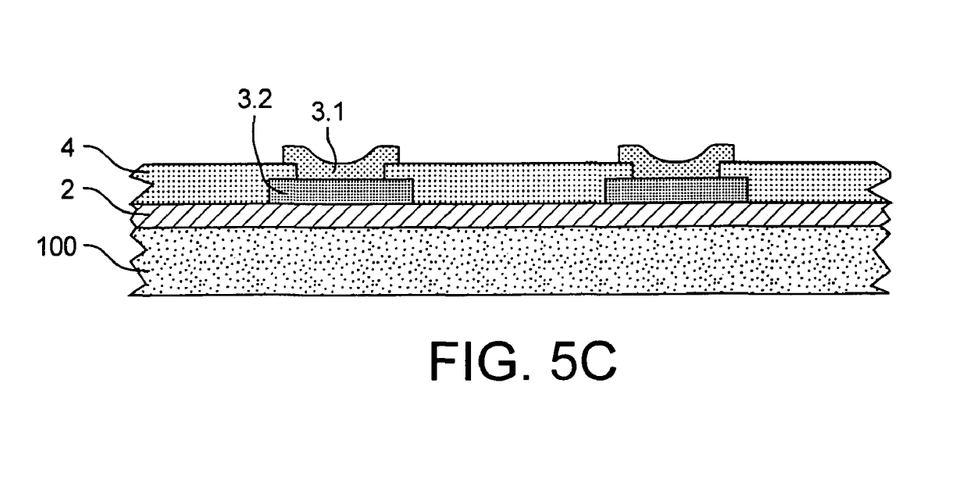

The memory material of the active central areas 3.1 is deposited in each of these wells 4.1 (FIG. 5C). This material may laterally overlap beyond the wells 4.1.

Figure 5D:
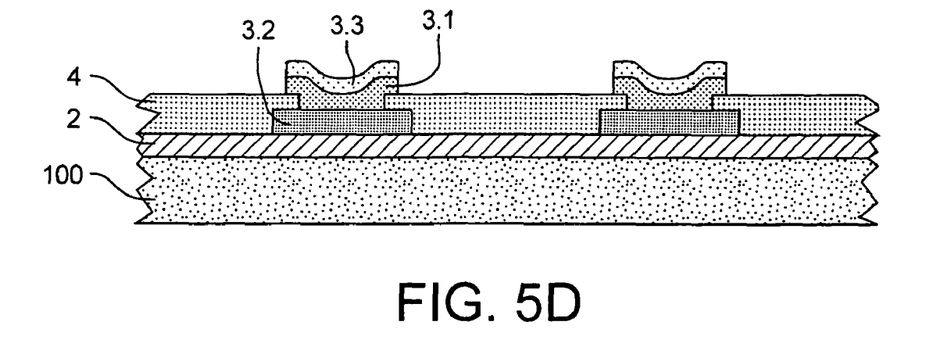

The second passive outmost areas 3.3 are then made by depositing above the wells 4.1, some passive phase-change material and by etching it in order to delimit their contour which may laterally extend beyond the wells 4.1 (FIG. 5D).

Figure 5E:
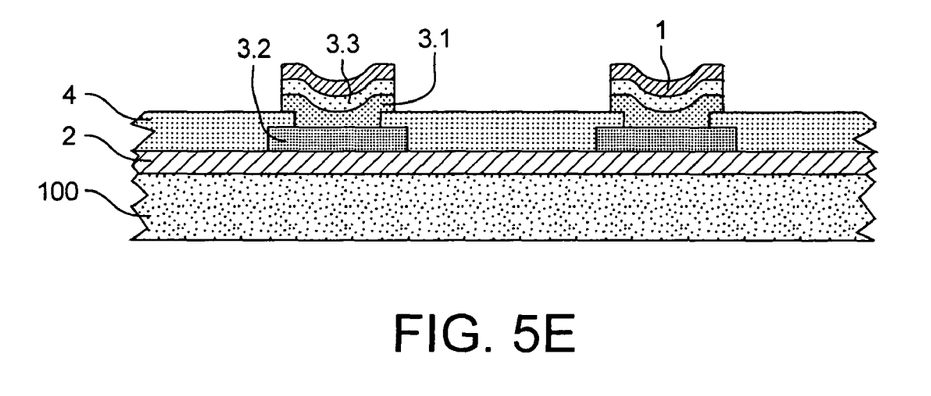

The second electrical contacts 1 are then made, there is one above each of the second passive outmost areas 3.3. A deposition of conducting material and an etching step are performed in order to delimit their contour (FIG. 5E).

Figure 5F:
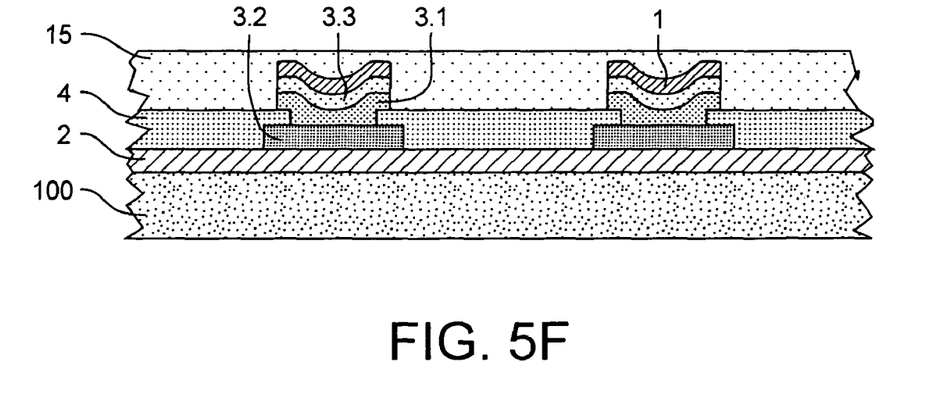

The whole of a protective layer 15 is then covered (FIG. 5F). This step is optional.

Still another alternative method for making at least one memory cell according to the invention will be described with reference to FIGS. 6A-6C.

One starts with the substrate 100 covered with a first electrical contact 2 similar to the one illustrated in FIG. 4A.

Figure 6A:
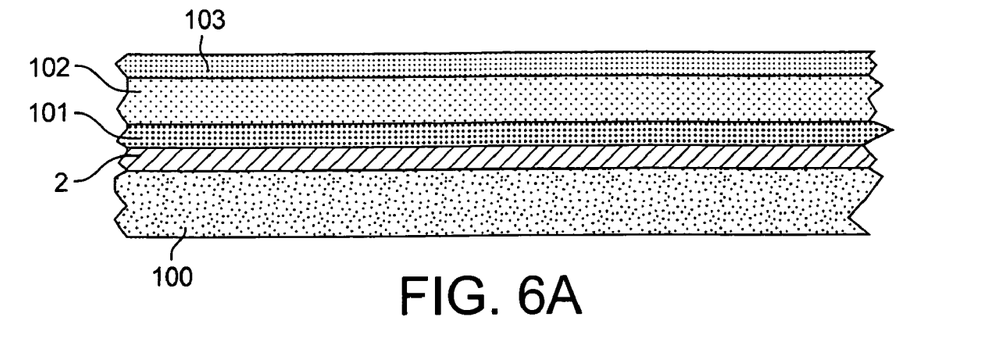
FIGS. 6A-6C illustrate certain steps of an alternative method for making memory cells according to the invention.
Figure 6B:
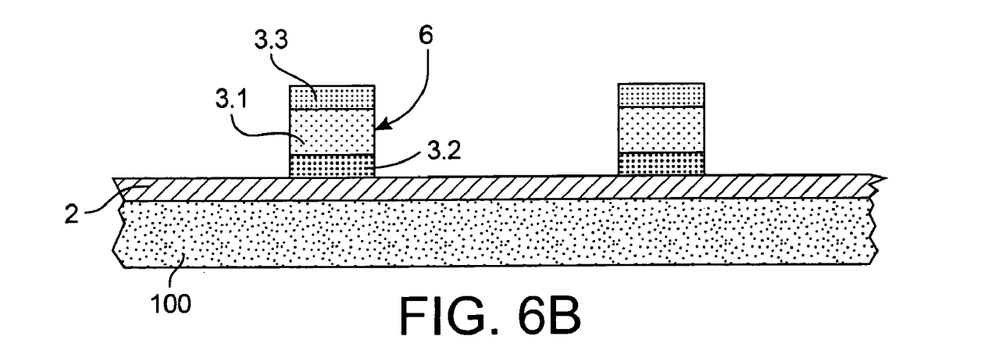
Figure 6C:
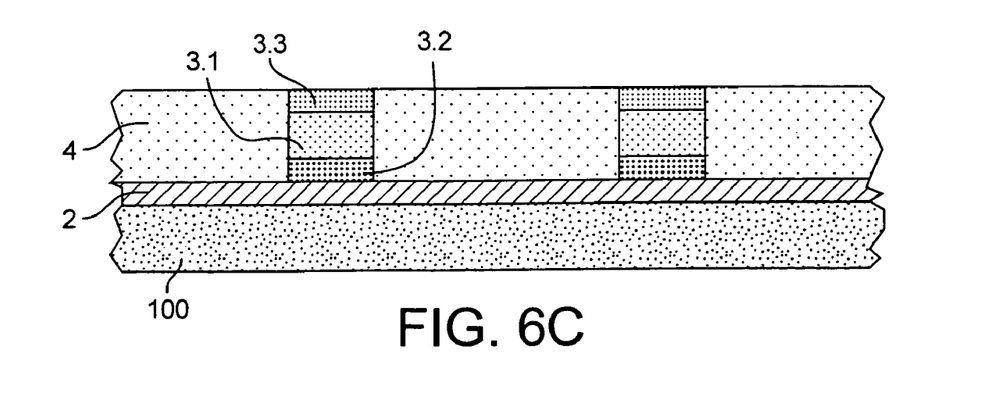

A stack of layers is successively deposited on the first electrical contact 2 with a first layer 101 leading for each memory cell, to the first passive outmost area, with a second layer 102 leading to the active central area, a third layer 103 leading to the second passive outmost area (FIG. 6A). This stack will then be structured by giving it the shape of a column 6 (per memory cell), so as to show the stack of passive outmost areas and of the active central area (FIG. 6B). Etching for example of the ion beam etching type (IEB) may be performed.

The columns 6 of electrically insulating material 4 will then be coated. This material may be deposited for example by PECVD. The electrically insulating material 4 may for example be silicon oxide or silicon nitride. The electrically insulating material 4 is then planarized by exposing the second passive outmost areas 3.3 (FIG. 6C).

Next the second electrical contacts 1 are made. One may proceed in the same way as for the step illustrated in FIG. 4E.

It is then possible, as illustrated in FIG. 4F, to deposit a protective layer 15 on the obtained assembly. An alternative to the thereby described method may consist of only making the active central area as a column instead of making the stack as a column.

Figure 7A:
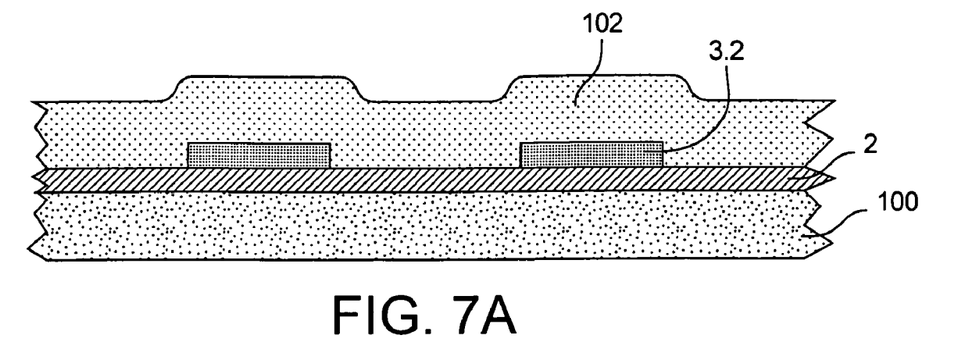
FIGS. 7A-7C illustrate certain steps of another alternative method for making memory cells according to the invention.
Figure 7B:
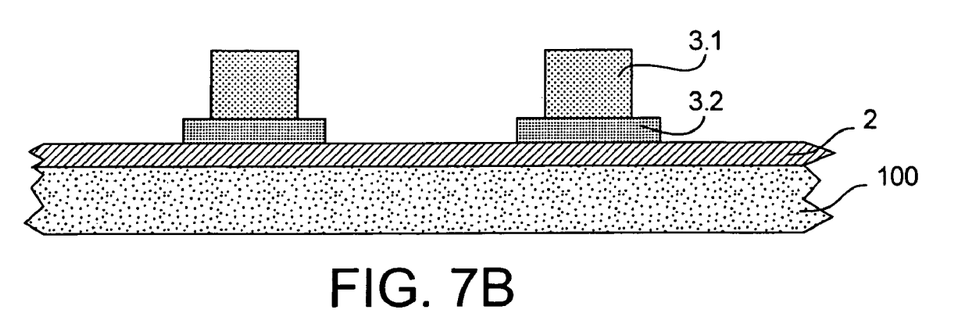
Figure 7C:
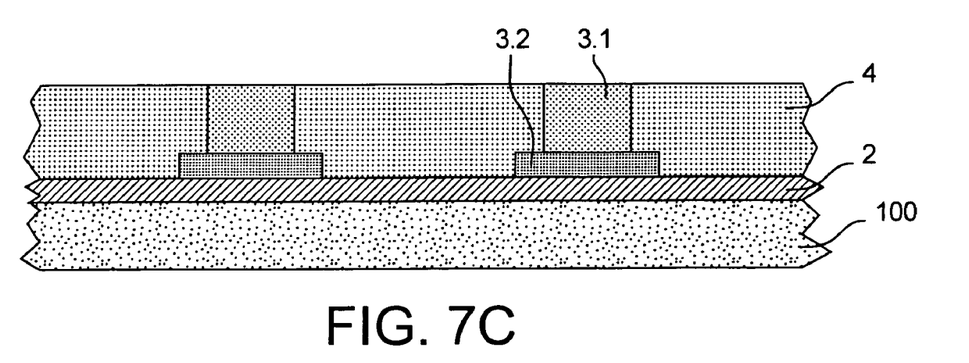

This alternative is illustrated in FIGS. 7A-7C.

One starts with the structure such as the one illustrated in FIG. 5A or the one illustrated in FIG. 4A with the first electrical contacts 2 and the first passive outmost areas 3.2. In order not to multiply the unnecessary figures, the following method is based on the structure of FIG. 5A.

A phase-change memory material layer 102 leading to the active central area (FIG. 7A) is deposited thereon. This layer is etched so as to delimit the active central area 3.1 of each of the memory cells (FIG. 7B).

Next an electrically insulating layer 4 is deposited, which laterally coats the first passive outmost areas 3.2 and active central areas 3.1. This electrically insulating layer 4 is planarized so as to expose the top of the active central areas 3.1 (FIG. 7C).

One then proceeds as explained in FIG. 5D and the following.

Although several embodiments of the present invention have been illustrated and described in detail, it is understood that different alterations and changes may be made thereto without departing from the scope of the invention notably as regards the procedures for performing the deposition and etching steps.

The invention claimed is:

1. A phase-change memory cell, comprising:
    between two electrical contacts, a portion in a memory material with an amorphous-crystalline phase-change and vice versa, as a stack with an active central area located between two passive outmost areas; and
    an interface between the active central area and each passive outmost area, each passive outmost area being made in a material having a melting temperature higher than that of the material of the active central area, the material of the passive outmost areas having very low solubility or zero solubility in the material of the active central area, the material of the passive outmost areas being a chalcogenide having the same chemical nature with a different composition of those of the material of the active area, the interface being inert or quasi-inert from a physico-chemical point of view even during a writing operation of the phase-change memory cell,
    wherein the material of the active central area includes between about 16% and 30% of tellurium and between about 70% and 84% of antimony, the material of each passive outmost area being antimony or antimony mixed with tellurium with a percentage ranging up to about 2%, these percentages being atomic percentages.

2. The phase-change memory cell according to claim 1, wherein each passive outmost area is made in a material having a thermal conductivity less than or equal to that of the material of the electrical contact which is closest to it.

3. The phase-change memory cell according to claim 1, wherein the passive outmost areas have, in a crystalline phase, an electrical resistance less than or equal to that of the active central area in a crystalline phase.

4. The phase-change memory cell according to claim 1, wherein each passive outmost area is made in a material promoting a phenomenon of formation of crystalline germs in the active central area in proximity to the interface.

5. The phase-change memory cell according to claim 1, further comprising an electrically insulating material, wherein the active central area is at least partially confined laterally by the electrically insulating material.

6. The phase-change memory cell according to claim 1, wherein at least one of the passive outmost areas laterally overlaps the active central area.

7. The phase-change memory cell according to claim 1, wherein at least one of the passive outmost areas and the active central area coincide laterally.

8. The phase-change memory cell according to claim 1, further comprising an electrically insulating material, wherein at least one of the passive outmost areas is bordered with the electrically insulating material.

9. The phase-change memory cell according to claim 1, wherein each passive outmost area is made in a material having a thermal conductivity less than or equal to that of the material of the active central area.

10. The phase-change memory cell according to claim 1, wherein
    each interface is directly between the active central area and one of the two passive outmost areas; and
    the material of the active central area has undergone a phase change.

11. A memory including a plurality of memory cells according to claim 1.

* * * * *